(12) United States Patent
Cheng et al.

(10) Patent No.: US 6,384,613 B1
(45) Date of Patent: *May 7, 2002

(54) WAFER BURN-IN TESTING METHOD

(75) Inventors: Jao-Chin Cheng; Ming-Hsien Chen, both of Hsinchu (TW)

(73) Assignee: AMIC Technology, Inc. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/064,264

(22) Filed: Apr. 22, 1998

(30) Foreign Application Priority Data

Feb. 16, 1998 (TW) ........................................ 87102080 A

(51) Int. Cl.$^7$ ........................... G01R 31/02; G01R 31/26
(52) U.S. Cl. ........................ 324/754; 324/760; 324/765; 324/757; 324/758
(58) Field of Search ................................. 324/754, 760, 324/765, 757, 758

(56) References Cited

U.S. PATENT DOCUMENTS

| | | | | |
|---|---|---|---|---|
| 4,771,234 A | * | 9/1988 | Cook et al. ................. | 324/754 |
| 4,777,716 A | * | 10/1988 | Folk et al. ............... | 324/754 X |
| 5,532,612 A | * | 7/1996 | Liang .......................... | 324/760 |
| 5,534,784 A | * | 7/1996 | Lum et al. .................. | 324/754 |
| 5,678,301 A | * | 10/1997 | Gochnour et al. ....... | 324/765 X |
| 5,940,680 A | * | 8/1999 | Lee et al. ...................... | 438/15 |
| 5,952,840 A | * | 9/1999 | Farnworth et al. .......... | 324/755 |
| 5,966,022 A | * | 10/1999 | Budnaitis et al. ........... | 324/760 |
| 6,016,060 A | * | 1/2000 | Akram et al. ................ | 324/757 |
| 6,064,213 A | * | 5/2000 | Khandros et al. ........... | 324/754 |
| 6,064,216 A | * | 5/2000 | Farnworth et al. .......... | 324/755 |
| 6,064,217 A | * | 5/2000 | Smith .......................... | 324/760 |
| 6,130,543 A | * | 10/2000 | Iino ............................. | 324/754 |

* cited by examiner

Primary Examiner—Safet Metjahic
Assistant Examiner—Wasseem H. Hamdan
(74) Attorney, Agent, or Firm—Blakely Sokoloff Taylor & Zafman

(57) ABSTRACT

A method for burn-in testing a complete wafer comprising the steps of first providing a wafer, and then forming a plurality of bumps thereon. Next, a tape-automated bonding tape having a plurality of bonding pads is designed and fabricated, wherein each bonding pad includes a corresponding circuit and an external contact point. Then, electrical connections between the bonding pads and the bumps are made and a plurality of voltages and currents are supplied through the tape-automated bonding tape for carrying out burn-in tests. Burn-in tests are performed for the whole wafer. Defective chips are singled out after the wafer is cut up and only good chips are used for subsequent packaging. Therefore, production cost can be saved and packaging yield can be increased. Furthermore, a multiple circuit layers design can be employed to fabricate the tape-automated bonding tape. Consequently, circuits necessary for carrying out the burn-in test for the whole wafer is simplified.

8 Claims, 5 Drawing Sheets

WAFER BURN-IN TESTING METHOD

CROSS-REFERENCE TO RELATED APPLICATION

This application claims the priority benefit of Taiwan application serial No. 87102080, filed Feb. 16, 1998, the full disclosure of which is incorporated herein by reference.

BACKGROUND OF THE INVENTION

1. Field of Invention

The present invention relates to a wafer burn-in testing method. More particularly, the present invention relates to a wafer burn-in testing method for testing all the components in a wafer.

2. Description of Related Art

FIG. 1 is a simplified diagram showing the manufacturing of an integrated circuit chip from a silicon wafer to final packaging. As shown in FIG. 1, after a series of steps for fabricating integrated circuits on a semiconductor wafer, a circular wafer 2 having a cut-away edge originally for facilitating alignment is produced. Because wafer fabrication produces a large number of individual chips 4 whose electrical properties may vary considerably, each of these chips 4 needs to be tested electrically. In general, a plurality of bonding pads 6 is formed on the periphery of each chip serving as testing points and/or subsequent connection. These bonding pads 6 can be used for testing the chips in two ways. First, before the wafer is cut up into individual dies or chips, mechanical probes can be used to form electrical contact with the bonding pad. Therefore, each chip 4 within the wafer can be individually electrically tested. Alternatively, after the wafer is cut into individual chips 8, wires can be bonded to the bonding pads 6. Then, the whole chip 8 can be enclosed within a package 10, and finally an integrated circuit (IC) package 12 or a large-scale integration (LSI) is formed. Electrical testing of the chip 8 can be carried out with ease after a complete package is formed because automatic testing machines can tap from the fixed external terminals and conduct the burn-in testing.

To connect from the bonding pads of a wafer chip to external terminals, a medium such as a wire or a bump must be used. FIG. 2 is a diagram showing a wire bonding method of connecting from the bonding pads on a wafer chip to external packaging. FIG. 3 is a diagram showing a tape-automated bonding (TAB) method of connecting from the bonding pads on a wafer to external packaging. FIG. 4 is a diagram showing a flip chip (FC) method of connecting from the bonding pads on a wafer to external packaging. In the wire bonding method as in FIG. 2, a piece of fine metallic wire is used to connect one of the bonding pads on the wafer chip to an external metal lead. In the tape-automated bonding method shown in FIG. 3, a piece of tape is used for connecting a bump on a bonding pad of a wafer chip to an external metal lead. In the flip chip (FC) method shown in FIG. 4, a solder bump between a bonding pad and a circuit film is used to connect the wafer chip to the external metallic terminals.

FIGS. 5A through 5G are cross-sectional views showing the progression of manufacturing steps needed to produce a bump. First, as shown in FIG. 5A, passivation layers 22 are formed on each side of aluminum bonding pad 20. Next, as shown in FIG. 5B, a titanium (Ti) layer 24 having a thickness of about 1000 Å is formed over the aluminum pad 20 and the passivation layers 22. Thereafter, a copper (Cu) layer 26 having a thickness of about 4000 Å is formed over the titanium layer 24. Then, as shown in FIG. 5C, a photoresist layer 28 having a thickness of between 30 μm to 40 μm is formed over the copper layer 26. Subsequently, using a mask 32 having chromium pattern 30 on it, a portion of the photoresist layer 28 is exposed to ultraviolet (UV) light. In the subsequent step, as shown in FIG. 5D, the exposed photoresist layer 28 is removed by etching to form a trench 34. After that, as shown in FIG. 5E, a layer of copper 36 with a thickness of about 8 μm is first deposited into the trench 34. Next, either lead-tin (SnPb) or gold (Au) solder is poured into the trench 34 forming a mushroom-shaped structure 38. Later, as shown in FIG. 5F, the photoresist layer 28 on each side of the mushroom-shaped lead-tin solder 38 is removed. Finally, as shown in FIG. 5G, a bump with a hemispherical-shaped upper profile is formed after further chemical treatment.

FIG. 6 shows the general IC layout for carrying out conventional burn-in testing. As shown in FIG. 6, a chip 48 in the middle is connected to external terminals for testing through a back plate 40 containing testing pads 42, inner-leads 44, outer-leads 46 and outer-leads holes 50. Therefore, a high-quality IC or LSI is obtained by first sawing the fabricated wafer into dies, then forming each die into a package, and finally the packaged product has to pass a burn-in test. The above procedure for obtaining a good die is known commonly as a known good die (KDG) method. Although the KDG method can obtain highly functional packages, the testing cost is exceptionally high because each chip has to be tested individually. Moreover, whenever a defect is found during testing, the whole package has to be scrapped leading to more waste due to cost spent on packaging.

In light of the foregoing, there is a need for a better burn-in testing method for wafers.

SUMMARY OF THE INVENTION

Accordingly, the present invention is to provide a method for testing the whole wafer so that defective wafer chips are detected and scrapped before the wafer is used for packaging. Hence, packaging cost can be saved and yield of packaged IC can be increased considerably.

In another aspect, this invention provides a method for testing the whole wafer by meshing the bonding pads on a tape-automated bonding (TAB) tape with bumps on the wafer so that complicated circuits can be avoided. In other words, the capacity to design two or more layers of internal circuits on a TAB tape is utilized such that internal circuits for carrying out the burn-in testing of the whole wafer can be greatly simplified.

In yet another aspect, this invention provides some tooling (fixtures) and a mechanism (suction caused by drawing a vacuum) for tightly engaging the bumps on the wafer with the pads on the TAB tape. Moreover, when the burn-in testing is finished, the TAB tape and the tooling can be used repeatedly for checking other wafers, one at a time. Therefore, the cost of operation is reduced to a minimum.

To achieve these and other advantages and in accordance with the purpose of the invention, as embodied and broadly described herein, the invention provides a method for carrying out wafer burn-in testing. The method comprises the steps of first providing a wafer and then forming a plurality of bumps on the wafer. Next, a tape-automated bonding (TAB) tape having a plurality of bonding pads is designed and fabricated. Each bonding pad has an external contact point and is electrically connected with an internal circuit. Pressure is applied to the wafer so that the bumps on the wafer can make contact with the bonding pads on the TAB tape. Subsequently, voltages and currents can be supplied to various bonding pads through the tape to carry out burn-in testing necessary for the whole wafer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
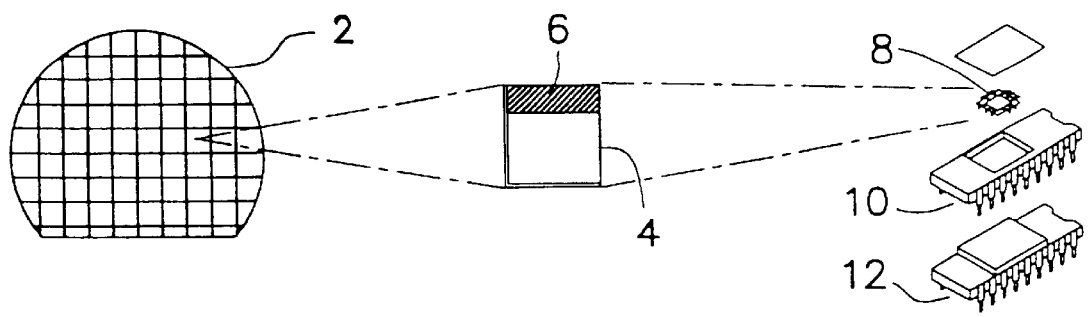
FIG. 1 is a simplified diagram showing the manufacturing of an integrated circuit chip from a silicon wafer to final packaging.
Figure 2:
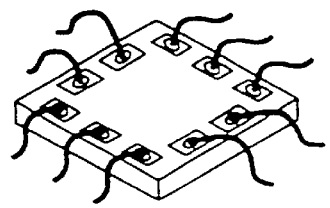
FIG. 2 is a diagram showing a wire bonding method of connecting from the bonding pads on a wafer chip to external packaging.
Figure 3:
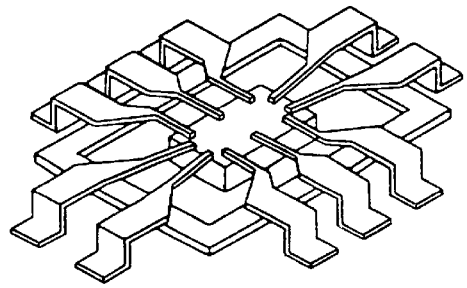
FIG. 3 is a diagram showing a tape-automated bonding (TAB) method of connecting from the bonding pads on a wafer to external packaging.
Figure 4:
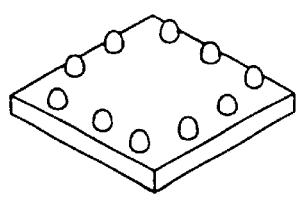
FIG. 4 is a diagram showing a flip chip (FC) method of connecting from the bonding pads on a wafer to external packaging.
Figure 5A:
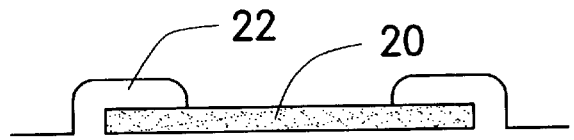
FIGS. 5A through 5G are cross-sectional views showing the progression of manufacturing steps in producing a bump.
Figure 5B:
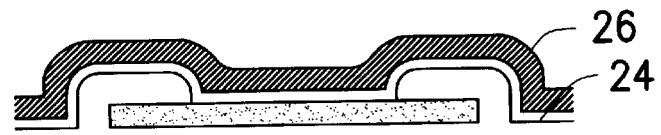
Figure 5C:
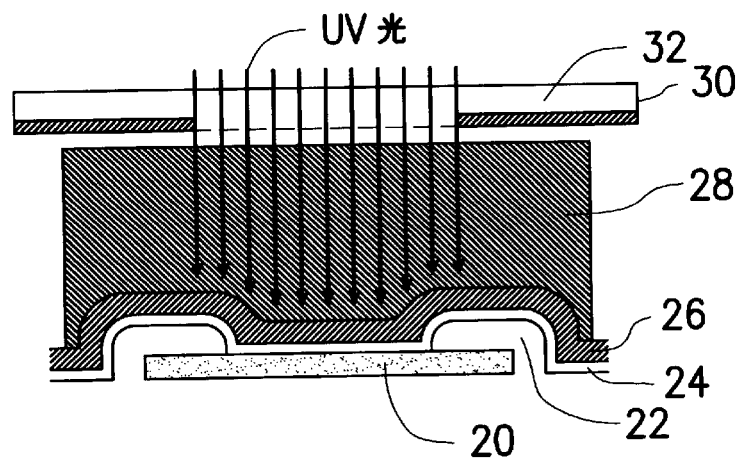
Figure 5D:
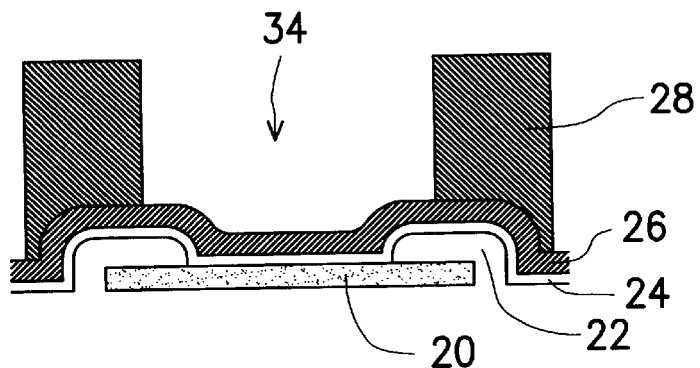
Figure 5E:
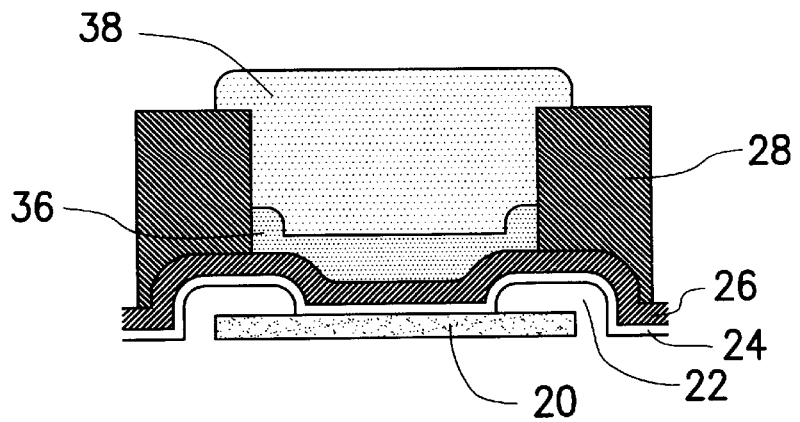
Figure 5F:
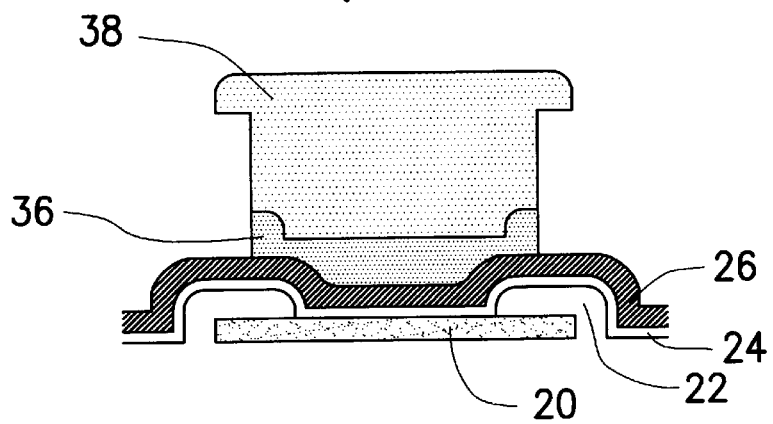
Figure 5G:
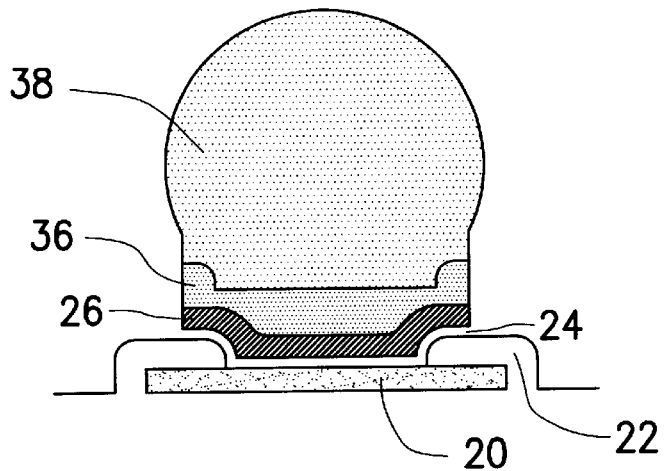
Figure 6:
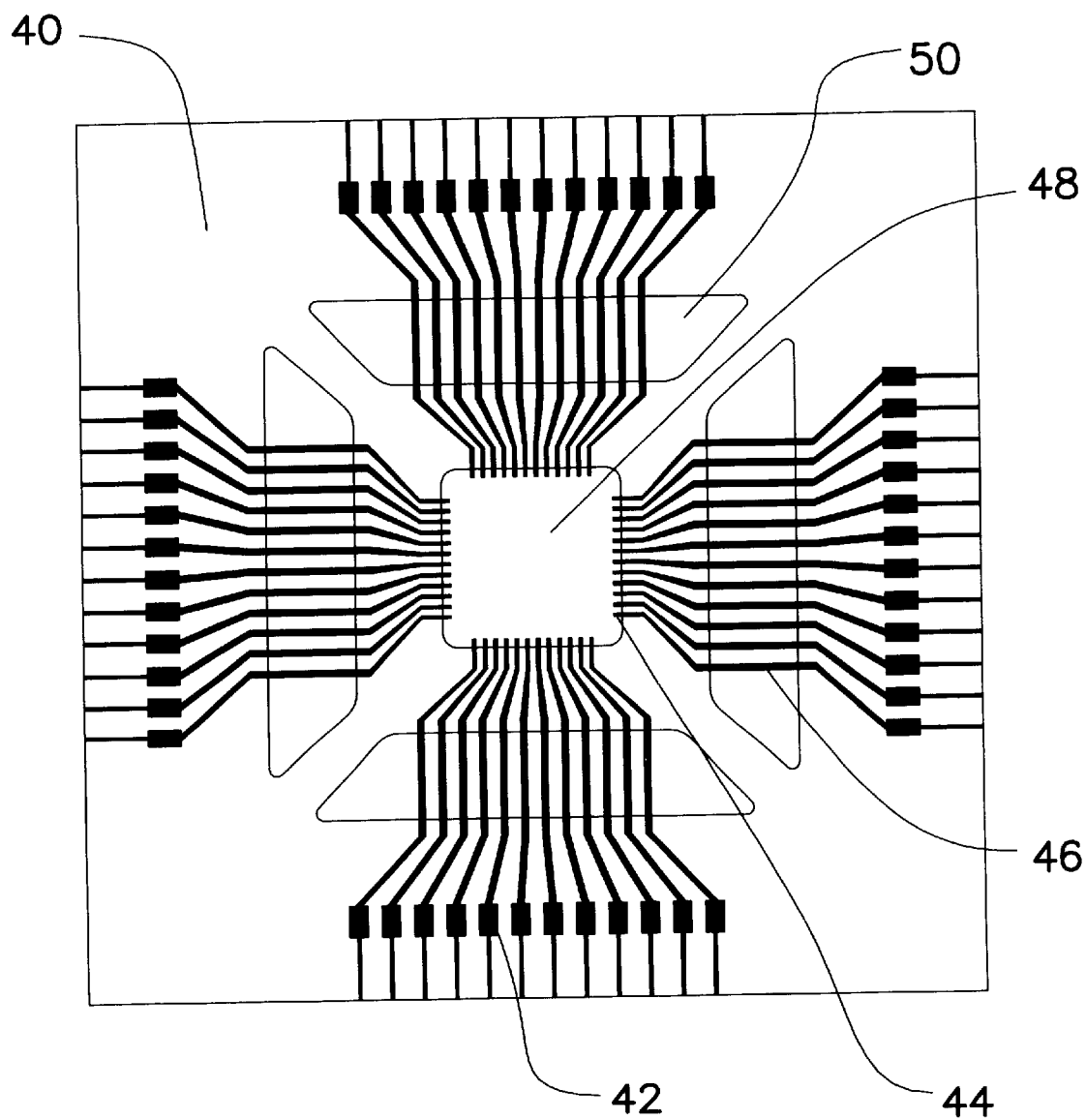
FIG. 6 shows the general IC layout for carrying out conventional burn-in testing.

Reference will now be made in detail to the present preferred embodiments of the invention, examples of which are illustrated in the accompanying drawings. Wherever possible, the same reference numbers are used in the drawings and the description to refer to the same or like parts.

Figure 7:
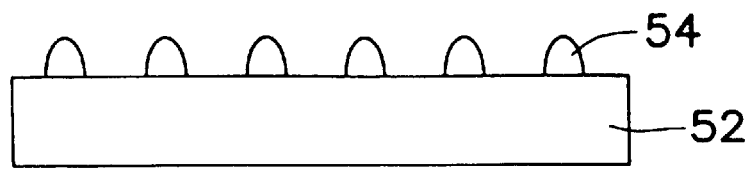
FIG. 7 is a cross-sectional view showing bumps formed on a silicon wafer according to the embodiment of this invention.
Figure 8:
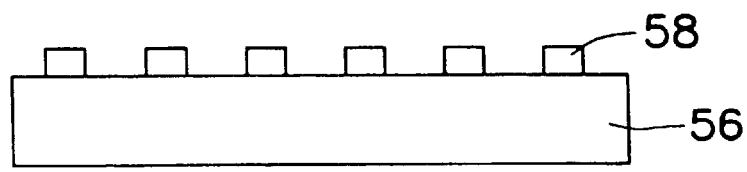
FIG. 8 is a cross-sectional view showing a plurality of bonding pads on a tape-automated bonding (TAB) tape according to the embodiment of this invention.
Figure 9:
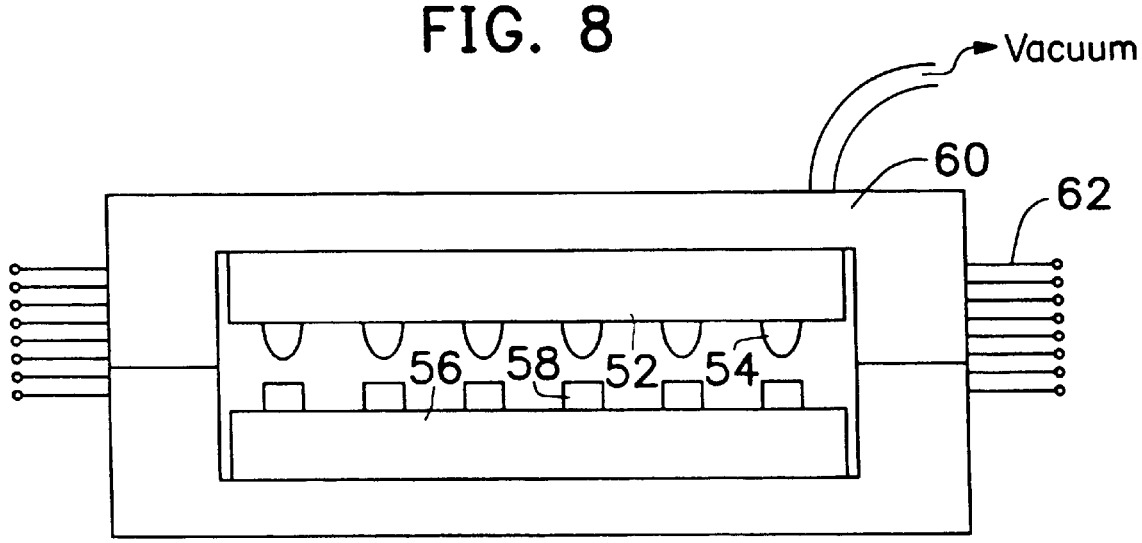
FIG. 9 is a cross-sectional view showing the bumps on a silicon wafer aligning with the bonding pads on a tape-automated bonding (TAB) tape through a special fixture that includes external connections for inputting voltages and currents for carrying out burn-in testing according to the embodiment of this invention.

FIGS. 7 through 9 shows the fabrications and fixtures necessary for carrying out a whole wafer burn-in test according to one preferred embodiment of this invention.

FIG. 7 is a cross-sectional view showing bumps formed on a silicon wafer according to the embodiment of this invention. As shown in FIG. 7, a silicon wafer 52 having a plurality of similar-sized chips, each chip having a plurality of bonding pads, is provided. First, a plurality of bumps 54 is formed on the respective bonding pads of the chips. Unlike in a conventional method, the bumps are formed on the surface of the whole wafer 52 before the chips are sawn out.

FIG. 8 is a cross-sectional view showing a plurality of bonding pads on a tape-automated bonding (TAB) tape according to the embodiment of this invention. As shown in FIG. 8, a plurality of bonding pads 58 is formed on a TAB tape 56. Each bonding pad 58 is connected to a corresponding circuit (not shown). Furthermore, each bonding pad 58 has an external contact point (not shown) located on another side of the bonding pad. In addition, the TAB tape 56 is capable of holding a plurality of circuit layers so that all the bumps on the wafer 52 can be accommodated.

First, the cut-away edge on one side of the wafer 52, which was originally used for specifying the crystal lattice orientation, is used as a means for aligning the bonding pads 58 with the bumps 54. A fixture 60 is used to enclose the TAB tape 56 and wafer 52. At this point, the bonding pads 58 and the bumps 54 are aligned and slightly in contact. They can then be brought into a secure engagement by, for example, drawing a vacuum within fixture 60 to create pressure ensuring the bonding pads 58 and the bumps 54 in contact with each other. In addition, the fixture 60 also has a plurality of external connecting wires 62. Through the tight contact between the bonding pad 58 and the bumps 54, information regarding vital electrical characteristics of the electrical circuits within any one particular chip can be retrieved from the wafer 52 via the contact point (not shown) of the tape 56 and the fixture 60 to external connection wires 62. Similarly, relevant voltages and currents for carrying out bum-in testing can be passed to each wafer chip via the same route. Consequently, any possible problems regarding the chips within the wafer can be checked through the arrangement.

If a problem is found in any one of the chips during a burn-in test, the defective chip can be marked. Ultimately, all the problematic chips can be singled out and discarded before packaging. Hence, processing time is saved and cost of production is lowered. Moreover, by selecting only the good ones for packaging, the product yield of IC will be increased considerably.

After burn-in testing of the whole wafer, pressure ensuring the bonding pads and the bumps in a tight contact can be released by removing the vacuum. Without the vacuum, the bonding pads separate from the bumps by opening the fixture. Hence, the fixture and the TAB tape can be used for testing another wafer again.

As a summary, this invention is able to provide complete testing for single wafers so that defective chips can be singled out after the chips are cut. Therefore, the packaging of defective chips is avoided. Furthermore, by designing and engaging a multi-layered tape-automated bonding tape with bumps on the wafer, complicated circuitry is unnecessary. Finally, by using a fixture and mechanism such as drawing a vacuum for tightening up contacts between the bonding pads and the bumps, the whole fixture and operation can be used again for testing another wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for burn-in testing a complete wafer comprising:

providing a wafer and then forming a plurality of bumps thereon;

designing a tape-automated bonding tape having a plurality of bonding pads, wherein each bonding pad includes a corresponding circuit and an external contact point;

aligning the wafer with the tape-automated bonding tape;

enclosing the wafer and the tap-automated bonding tape by a fixture;

drawing a vacuum within the fixture to create pressure in order to ensure the wafer and the tap-automated bonding tap in contact with each other and establish electrical connections between the bonding pads and the bumps; and supplying a plurality of voltages and currents through the tape-automated bonding tape for carrying out testing.

2. The method of claim 1, wherein the step of carrying out the testing includes performing a burn-in test for the whole wafer.

3. The method of claim 1, wherein the corresponding circuit includes a plurality of circuit layers.

4. The method of claim 1, wherein the step of carrying out the testing includes utilizing the external contact point for supplying voltage and current inputs to the tape-automated bonding tape.

5. The method of claim 1, wherein alignment between the bumps on the wafer and the bonding pads on the tape-automated bonding tape for electrical connection is achieved through the cut-away edge of the wafer originally intended for marking crystal lattice direction.

6. The method of claim 1, wherein the wafer and the tape-automated bonding tape are enclosed within the fixture so that the bumps on the wafer are able to make electrical contact with the bonding pads.

7. The method of claim 6, wherein the fixture further includes a plurality of external wiring connections leading from the external contact point of the tape-automated bonding tape.

8. A method for testing a wafer, comprising:

forming a plurality of bumps on the wafer;

providing a tape-automated bonding tape having a plurality of bonding pads, wherein each bonding pad includes a corresponding circuit and an external contact point;

aligning the wafer with the tape-automated bonding tape using a fixture;

drawing a vacuum to create pressure in order to establish electrical connections between the bonding pads and the bumps, wherein testing of the wafer is carried out by supplying a plurality of voltages and currents through the tape-automated bonding tape; and removing the vacuum to release pressure between the bonding pads and the bumps after the testing has been carried out to separate the bonding tape and the fixture from the wafer.

* * * * *